United States Patent [19]
Morikawa

[11] Patent Number: 5,308,682
[45] Date of Patent: May 3, 1994

[54] ALIGNMENT CHECK PATTERN FOR MULTI-LEVEL INTERCONNECTION

[75] Inventor: Takenori Morikawa, Tokyo, Japan
[73] Assignee: NEC Corporation, Tokyo, Japan
[21] Appl. No.: 955,027
[22] Filed: Oct. 1, 1992
[30] Foreign Application Priority Data
  Oct. 1, 1991 [JP] Japan .................. 3-253256
[51] Int. Cl.⁵ .................. B32B 9/00
[52] U.S. Cl. .................. 428/195; 257/797; 428/209; 428/210; 428/688; 428/689
[58] Field of Search ........... 428/195, 209, 901, 688, 428/689, 210; 356/401; 437/924, 229; 257/797, 520, 620, 752

[56] References Cited
U.S. PATENT DOCUMENTS
3,863,331  2/1975  Schade .................. 437/924
4,423,127  12/1983  Fujimura .................. 356/401
4,916,514  4/1990  Nowak .................. 257/752

FOREIGN PATENT DOCUMENTS
148819  7/1986  Japan .................. 437/924
149435  6/1989  Japan .................. 437/924
251599  7/1989  Japan .................. 437/924

Primary Examiner—Patrick J. Ryan
Assistant Examiner—Patrick Jewik
Attorney, Agent, or Firm—Burns, Doane, Swecker & Mathis

[57] ABSTRACT

An alignment check pattern formed by a first insulating film; a first dummy pattern formed on a surface of said first insulating film; a second insulating film formed on a composite surface of said first insulating film and said first dummy pattern; a second dummy pattern formed on said second film, and positioned directly over said first dummy pattern in plan view; a third insulating film formed on a composite surface of said second insulating film and said second dummy pattern; a regular scale pattern formed on said third insulating film, and positioned directly over said second dummy pattern; fourth insulating film formed on a composite surface of said third insulating film and said regular scale pattern; and a vernier scale pattern formed on a surface of said fourth insulating film and positioned directly over said regular scale pattern.

20 Claims, 10 Drawing Sheets

ALIGNMENT CHECK PATTERN FOR MULTI-LEVEL INTERCONNECTION

BACKGROUND OF THE INVENTION

1. Field of the Invention

Present invention relates to an alignment check pattern, more particularly to an alignment check pattern for a multi-level interconnection of more than three levels.

2. Description of the Prior Art

Typically, the complexity of a multi-level interconnection structure used is in proportion to the degree of complexity of the integrated circuits. In a multi-level interconnection structure, it is necessary to improve alignment accuracy for certain connection between upper and lower level wirings via through holes which are formed in a interlayer insulating film. Because the through holes are provided for the interlayer insulating film in accordance with the location of lower level wirings, and the upper level wirings are patterned in accordance with the location of the through holes, it is necessary to raise the alignment accuracy of the horizontal direction with reference to each of the wirings and the through holes.

Alignment check patterns are formed on the surface of a substrate on which the multi-level interconnection structure is formed to confirm whether the alignment is as expected. The alignment check pattern may be called a vernier caliper.

An alignment check pattern to inspect the alignment between certain level wirings and a through hole provided in an interlayer insulating film which is formed between the wirings comprises a regular scale patterns formed at the same time as the patterning of the lower wirings and made of same material, and vernier scale patterns formed at the same time as the forming of openings at a photoresist film which is formed on the interlayer insulating film to provide through holes in the interlayer insulating film. The regular scale patterns are made up of a plurality of rectangular shape patterns arranged at the regular intervals. The vernier scale patterns are made up of a plurality of openings each having a rectangular shape formed at the photoresist film and arranged at the regular intervals which is not the same as the intervals of the regular scale patterns.

Detection of a misalignment amount at an alignment exposure is performed by observing the misalignment amount between the regular scale patterns and the vernier scale patterns using an optical microscope or the like.

According to the detection result, after adjusting the location where the mask pattern for forming contact holes is formed, openings are provided in the interlayer insulating film using the mask pattern as an etching mask. After removing the mask pattern, the upper level wirings are formed on a surface of the interlayer insulating film to fill in the openings. In this way, connections between the upper level wirings and the lower level wirings can be performed for at least a two level interconnection structure.

Due to an increase in the scale of semiconductor integrated circuit devices, a one or two level interconnection may be insufficient and a highly integrated, multi-level interconnection of at least three levels may become necessary. In the case of forming peripheral marks such as the alignment check patterns, accompanying the increase in the number of levels in multi-level interconnection, a step difference between an inside part of the integrated circuit and the peripheral mark part (such as the alignment check pattern) occur as a result of the absence of a lower metallic wiring formed below the regular scale patterns of the previous processing step. As the result of the step difference, the alignment exposure may become out of focus. Therefore, a problem is presented in that it is difficult to accurately expose both the inside integrated circuit part of the photoresist and the peripheral mark part of it at the same time.

BRIEF SUMMARY OF THE INVENTION

An object of the present invention is to provide an alignment check pattern which is favorable to a multi-level interconnection of at least three levels.

The present invention is an alignment check pattern used for a multi-level wiring structure having a first level wiring formed on a major surface of a first insulating film, a second insulating film formed to cover the major surface of the first insulating film and the surface of the first level wiring, a second level wiring formed on a major surface of the second insulating film, and a third insulating film formed to cover the major surface of the second insulating film and the surface of the second level wiring. The alignment check pattern comprises a plurality of dummy patterns formed between the first and the second insulating films and substantially having the same thickness as the first level wiring, and a plurality of regular scale patterns formed between the second and the third insulating films and substantially having the same thickness as the second level wiring.

According to the present invention, as the height of the third insulating film formed on the second level wiring from the major surface of the first insulating film becomes equal to the height of the third insulating film formed on the plurality of regular scale patterns from that of the first insulating film, openings (which become a plurality of vernier scale patterns) can be accurately provided in the photoresist film when an exposure for at least providing an opening for through hole formatting in the photoresist film (which will be formed on the major surface of the third insulating film) is performed.

BRIEF DESCRIPTION OF THE DRAWINGS

The above-mentioned and other objects, features and advantages of this invention will become more apparent by reference to the following detailed description of the invention taken in conjunction with the accompanying drawings, wherein:

FIG. 2b is a sectional view taken along the X—X line of the FIG. 2a;

FIGS. 4b and 4c are sectional views taken along the C—C line and the D—D line of the FIG. 4a;

FIGS. 4d and 4e are sectional views showing other features taken along the C—C line and the D—D line of the FIG. 4a.

DETAILED DESCRIPTION OF THE INVENTION

Preceding a description of the invention, a conventional alignment check pattern will be described with reference to the figures.

Figure 1:
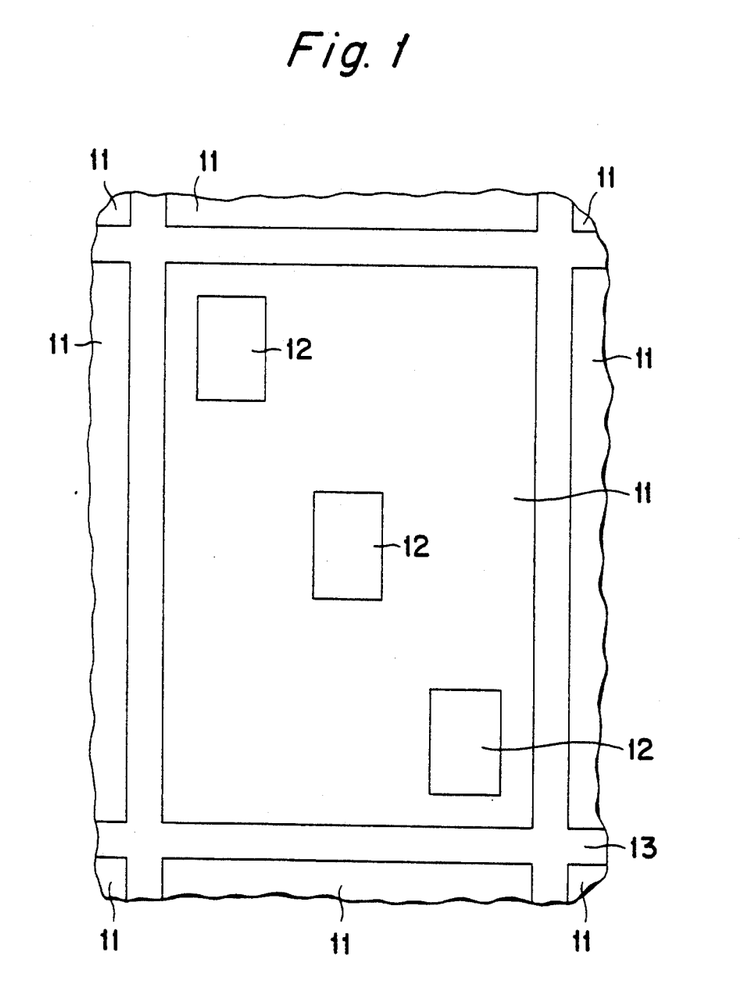
FIG. 1 is a partial plan view of a wafer showing locations where the alignment check patterns are formed.

Referring to the FIG. 1, a plurality of device regions 11 having the same patterns is ordinally arrayed and formed in a wafer. The circumference of the device regions 11 becomes a scribe region 13. After the formation of the device regions 11, the wafer is divided along the scribe region 13 into plurality of devices, and the devices are packaged.

The alignment check patterns are formed in, for example, three regions 12 positioned on a diagonal line in a device region 11. As the result of this formation, one can detect a misalignment amount caused by rotation of the mask pattern for as well as misalignment amounts in the horizontal or vertical directions, alignment exposure.

Figure 2A:
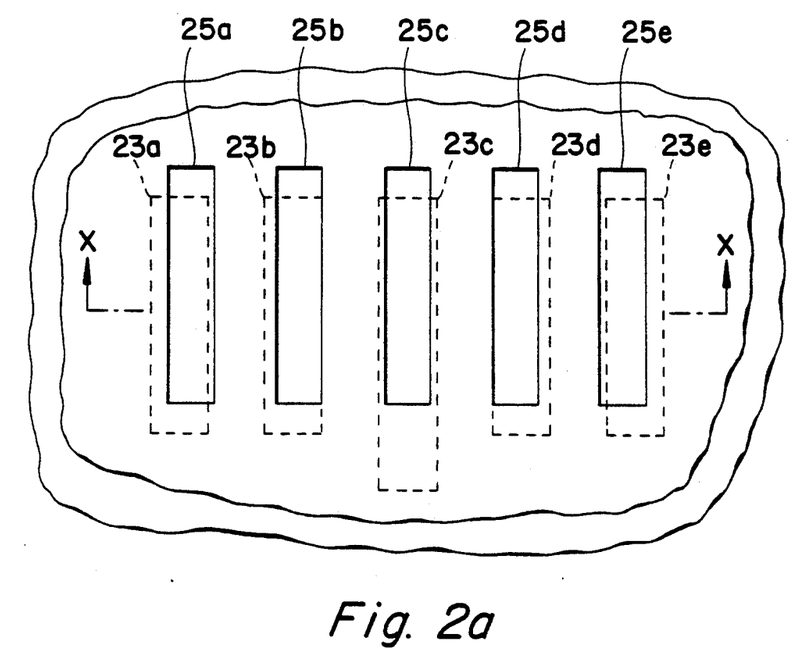
FIG. 2a is a plan view showing the alignment check pattern of the prior art.
Figure 2B:
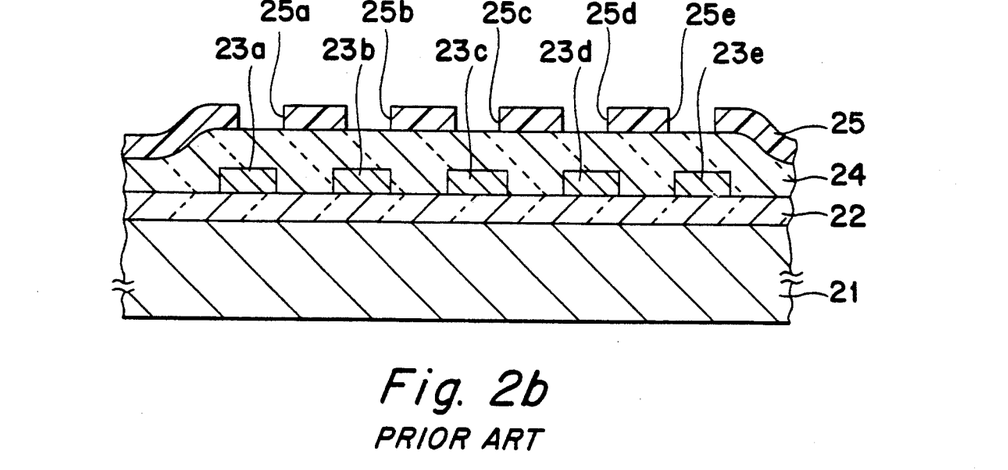

What is used for improving the alignment accuracy between the first level wirings and the through holes provided in the first interlayer insulating film formed on the first level wirings is the conventional alignment check pattern as shown in FIGS. 2a and 2b. As shown in FIG. 2b, which is the sectional view taken along the X—X line in the FIG. 2a, regular scale patterns 23a-23e are arranged at regular intervals and formed on an insulating film 22 formed on a semiconductor substrate 21. A first interlayer insulating film 24 is formed on the regular scale patterns 23a-23e and vernier scale patterns 25a-25e are arranged at regular intervals and formed on the interlayer insulating film 24. The vernier scale patterns 25a-25e are openings formed at a photoresist film 25. As shown in FIG. 2a, each of the regular scale patterns 23a-23e is formed with a same width. The vernier scale patterns 25a-25e are formed with a narrow width compared with the regular scale patterns 23a-25e. The regular scale patterns 23a-23e are arranged at different regular intervals compared with the vernier scale patterns 25a-25e. The regular scale patterns 23a-23e are made of the same material as the first level wirings which are also formed on the insulating film 22. The formation of the regular scale patterns 23a-23e is simultaneous with the patterning for the first-level-wiring formation. The formation of the vernier scale patterns 25a-25e is simultaneous with a formation of openings at the photoresist film 25 which are used as a mask for making through holes at the interlayer insulating film 24.

Observing the locational relationship between the regular scale patterns 23a-23e and the vernier scale patterns 25a-25e using the optical microscope or the like, a locational relationship between the first level wirings and the through holes formed at the first interlayer insulating film 24 can be detected. As the result of the observation, when two parts in the same width of the regular scale pattern 23c are seen at both sides of the vernier scale pattern 25c, the first level wirings and the openings for through hole formations are arranged accurately. As the result of the observation, when two parts in the same width of the regular scale pattern 23b are seen at both sides of the vernier scale pattern 25b, the openings for the through hole formations are misarranged against the first level wirings in the left direction. When the openings for through hole formation are misaligned in the left direction, exposure to the photoresist film 25 is performed, following shifting the exposure mask to form a mask pattern in the photoresist film 25 in the right direction by the amount of the alignment error. As the result of the observation, when two parts in the same width of the regular scale pattern 23d are seen at both sides of the vernier scale pattern 25d, the openings for the through hole formations are misaligned against the first level wirings in the right direction. When the openings are misarranged in the right direction, exposure for the photoresist film 25 is performed, following shifting the exposure mask in the left direction by the amount of the alignment error. When either the relationship between the regular scale pattern 23a and the vernier scale pattern 25a or the relationship between the regular scale pattern 23e and the vernier scale pattern 25e are the same as described above, after shifting the exposure mask by the misaligned amount, the exposure is performed. After the arrangement using the alignment check pattern, the through holes are provided for the first interlayer insulating film 24 using the photoresist film 25 as an etching mask. Then, after removing the photoresist film 25, the second level wirings are formed on the surface of the first interlayer insulating film and connected with the first level wirings via the through holes. As the result of the processes, the two-level interconnection can be formed.

After this, a case of forming a multi-level interconnection of at least three levels will be considered. In order to form it, it is necessary to accurately align the second level wirings and through holes which are provided for the second interlayer insulating film formed on the second level wirings. In order to align it, the conventional alignment check pattern may be tried to be used. Regular scale patterns of the alignment check patterns are formed on the surface of the first interlayer insulating film 24 at the region 12 alignment check pattern. Then, the second interlayer insulating film covering the second level wirings,, the regular scale patterns and the first interlayer insulating film are formed. Through holes, which are formed at the second interlayer insulating film, are called second through holes.

An exposure to provide the photoresist film with openings for the second-through-hole formation in the second interlayer insulating film is performed. Then, openings are formed in the photoresist film. When exposure to form the vernier scale patterns in the alignment-check-pattern forming region is simultaneously performed when forming the second through hole, since the photoresist film at the portion where the vernier scale pattern is to be formed is out of focus (assuming it is in focus for formation of openings for the second-through-hole formation), there is a problem that forming vernier scale patterns cannot be performed accurately. Therefore, when the vernier scale patterns cannot be formed accurately, a problem occurs in that detecting the misalignment amount in combination with the regular scale patterns cannot be executed.

Hereinafter, a first embodiment of the present invention is described with reference to the drawings. Through holes formed in a first, second and third interlayer insulating films are called first, second and third through holes, respectively, hereinafter. Alignment check patterns used for location adjustment between the first level wirings and the first through holes, between the second level wirings and the second through holes and between the third level wirings and the third through holes are called a first, second and third alignment check patterns, respectively.

Figure 3A:
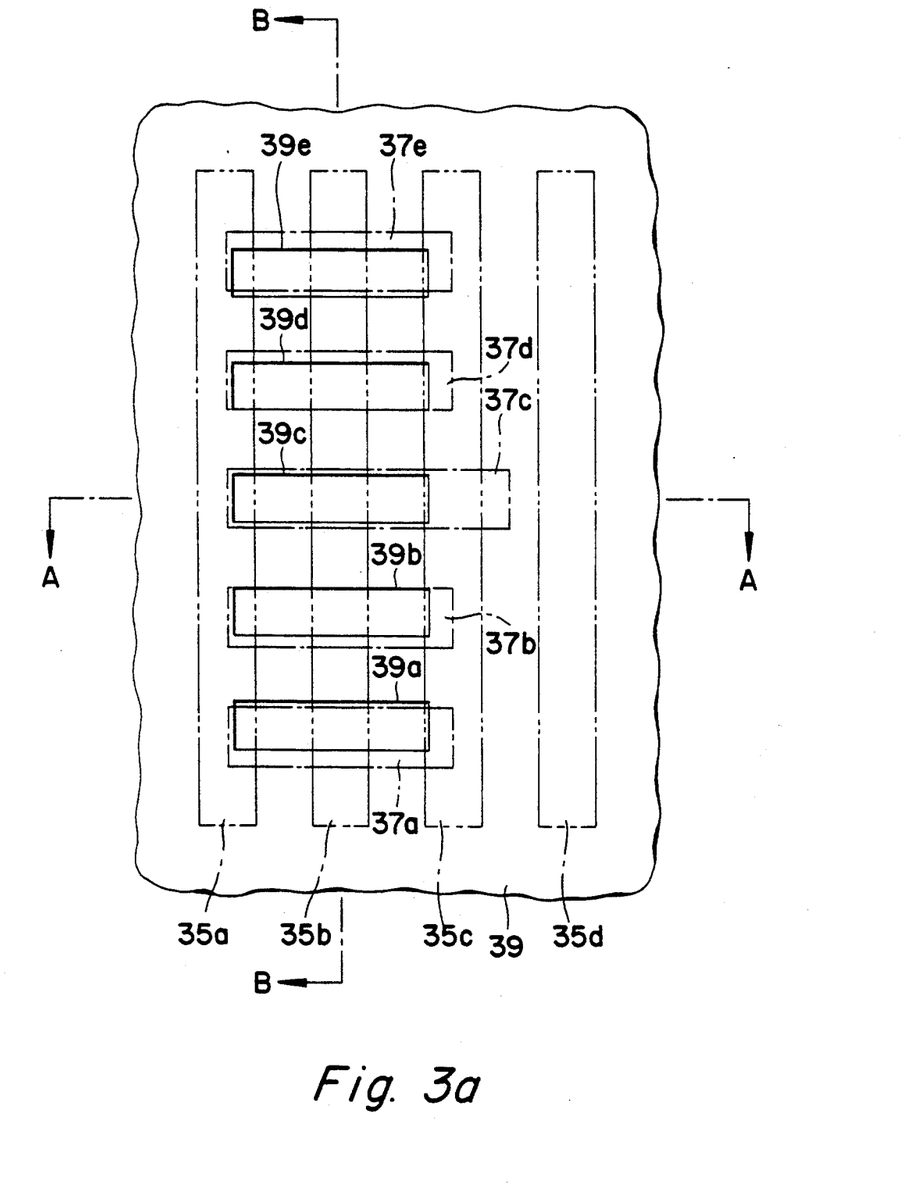
FIG. 3a is a plan view showing a first embodiment of the present invention.

As shown in FIG. 3a, vernier scale patterns 39a–39e are openings provided in a photoresist film 39, and are shown by solid lines. The openings are arranged at regular intervals of 2.2 μm and formed with an inside width of 1.8 μm, for example. Regular scale patterns 37a–37e are shown by chain lines in the drawing. The patterns are arranged at regular intervals of 2.0 μm and have a width of 2.0 μm, for example. An interlayer insulating film formed between the regular scale patterns and the vernier scale patterns or the like is formed by the following processes, for example. After growing a silicon oxide film of about 1.0 μm thick with good coverage, the silicon oxide film is applied to coating material.

Figure 3B:
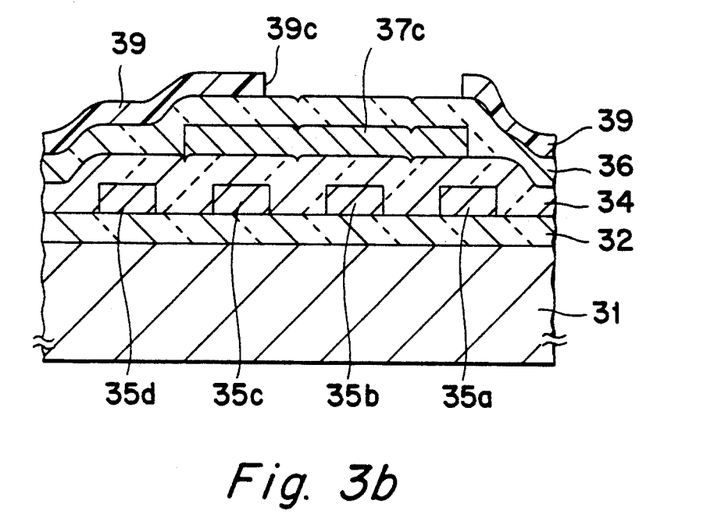
FIGS. 3b and 3c are sectional views taken along the A—A line and the B—B line of the FIG. 3a, respectively.
Figure 3C:
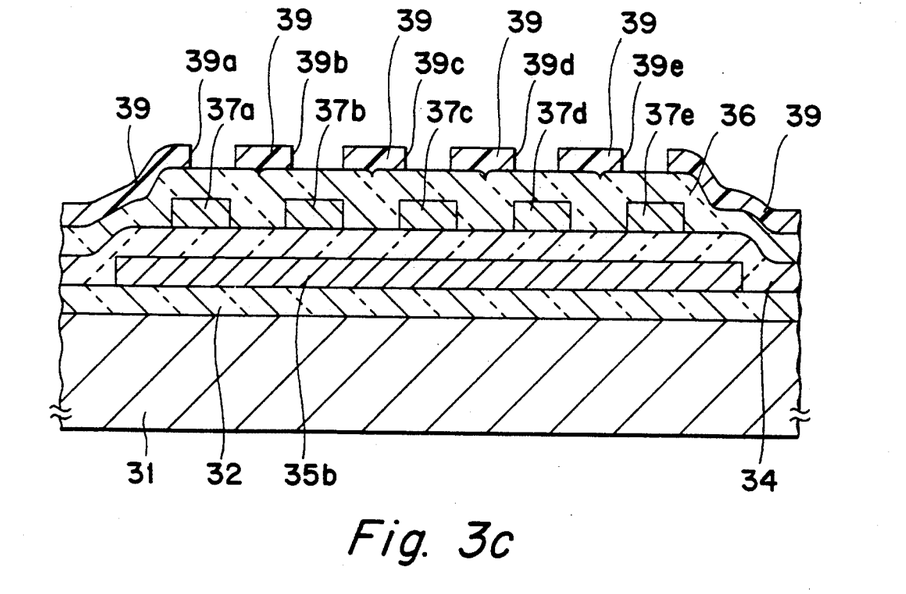
Figure 3D:
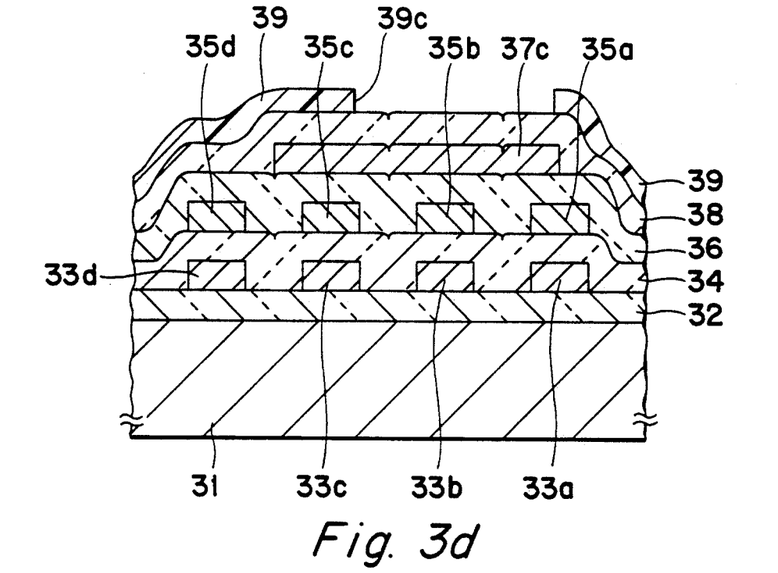
FIGS. 3d and 3e are sectional views showing other features taken along the A—A line and the B—B line of the FIG. 3a, respectively.
Figure 3E:
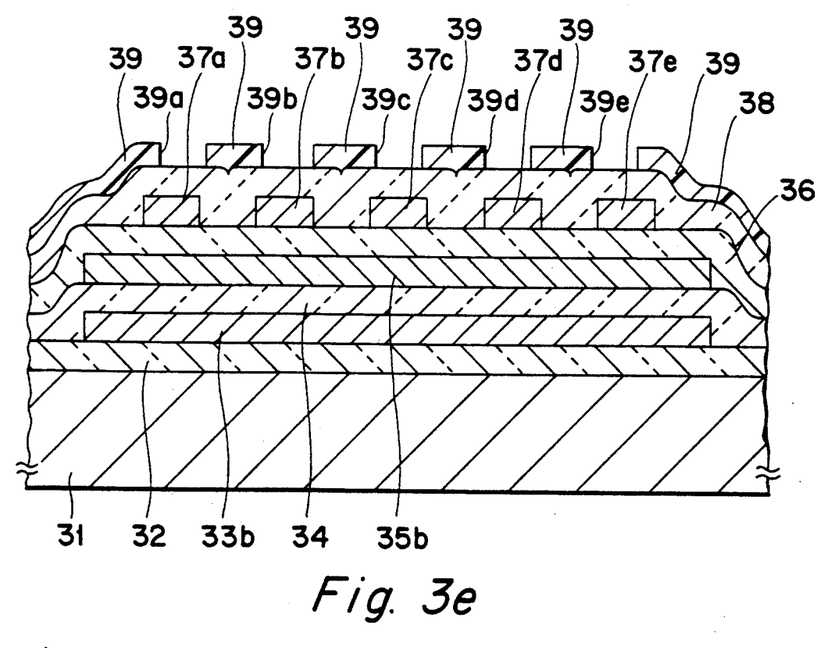

In this embodiment, dummy patterns 35a–35d are provided for the alignment check pattern, and are shown by chain double-dashed lines. The dummy patterns 35a–35d are formed below the regular scale patterns and cross each pattern of the alignment check pattern. Moreover, chinks are formed between the dummy patterns. Therefore, when the alignment check pattern shown in the FIG. 3a is observed, detection of where the edges of the regular scale patterns 37a–37e are becomes easy to perform, even if the dummy patterns 35a–35e and the regular scale patterns 37a–37e are made of the same material or have similar color. FIGS. 3b and 3c are sectional views of the FIG. 3a for the second alignment check pattern. The dummy patterns 35a–35d are formed on an insulating film 32 formed on a substrate 31. The patterns are formed by sputtering an aluminum film of about 1.0 μm thick and patterning the film, for example. A first interlayer insulating film 34 is formed on a surface of the dummy patterns and the insulating film 32. Regular scale patterns 37a–37e of the second alignment check pattern are formed on a surface of the first interlayer insulating film 34. FIGS. 3d and 3e are sectional views of the FIG. 3a for the third alignment check pattern. Second dummy patterns 35a–35d are formed below the regular scale patterns 37a–37e of the third alignment check pattern via second interlayer insulating film 36. Moreover, just below the second dummy patterns 35a–35d, a first dummy patterns 33a–33d are formed via the first interlayer insulating film 34. Preferably, the second dummy patterns 35a–35d are formed right over the first dummy patterns 33a–33d, and are formed with the same shape as the patterns 33a–33d, respectively. Setting the first and the second dummy patterns the same shape like thus, the first dummy patterns disappear in a plan view as FIG. 3a because of overlapping each other.

Figure 5A:
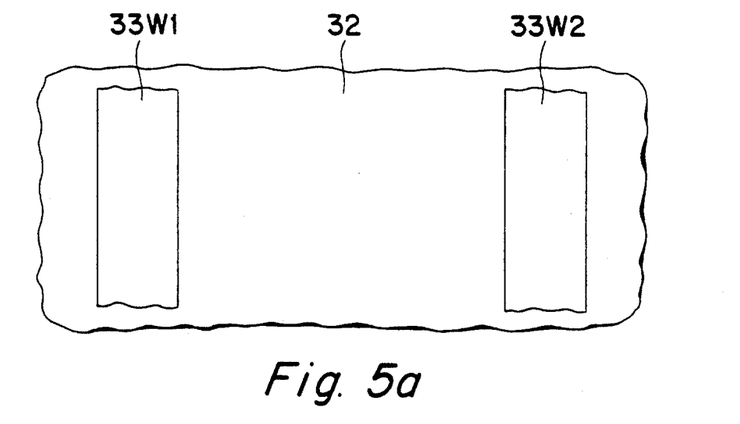
FIGS. 5a to 5f are partial plan views arranged in the order of the manufacturing process for describing the method for manufacturing a multi-level interconnection.

After this, a method for manufacturing the alignment check pattern according to the present embodiment will be described with reference to the plan views arranged in the order of the manufacturing processes of the multilevel interconnection structure. In the figures, patterns formed at a surface are shown by solid lines and other patterns 5 which are invisible are shown by chain lines. As shown in FIG. 5a, first level wirings 33W1 and 33W2 are formed on a surface of the insulating film 32 over a substrate at a wiring forming region. The regular scale patterns 23a–23e of the first alignment check pattern shown in FIG. 2a, the dummy patterns 35a–35d of the second alignment check pattern shown in FIG. 3b and the first dummy patterns 33a–33d of the third alignment check patterns shown in FIG. 3d are also formed simultaneously with the first-level-wiring formation. After sputtering an aluminum film on the insulating film 32 and patterning the aluminum film, those wirings and patterns are formed. Each of the wirings 33W1 and 33W2, and the patterns 23a–23e, 35a–35d and 33a–33d is made of the same aluminum film, and have same thickness.

Figure 5B:
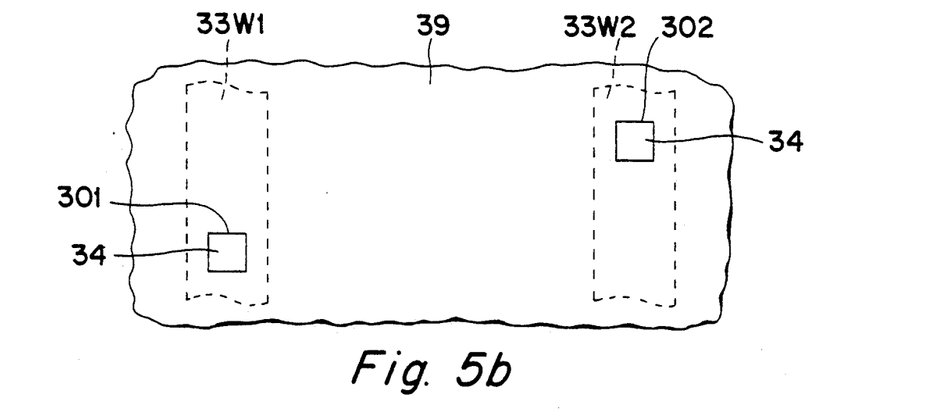

As shown in FIG. 5b, the first interlayer insulating film 34, which covers the first level wirings, the regular scale pattern of the first alignment check pattern, the dummy pattern of the second alignment check pattern, the first dummy pattern of the third alignment check pattern and the insulating film 32, is formed. On the first interlayer insulating film 34, a photoresist film 39 is formed. In addition, openings 301 and 302, which are for through hole formation, are provided for the film 39. In the figure, the underlying insulating film 34 appears at the openings 301 and 302. vernier scale patterns of the first alignment check pattern are also formed at the same time when the openings are formed. An alignment check, which uses the regular scale patterns and the vernier scale patterns of the first alignment check pattern, is performed. After the alignment check, first through holes 303 and 304 are provided for the first interlayer insulating film 34 using the photoresist film 39 as an etching mask. As the vernier scale patterns 25a–25e are openings provided for the photoresist film 39, openings are formed at the first-alignment-check-pattern part of the first interlayer insulating film 34.

Figure 5C:
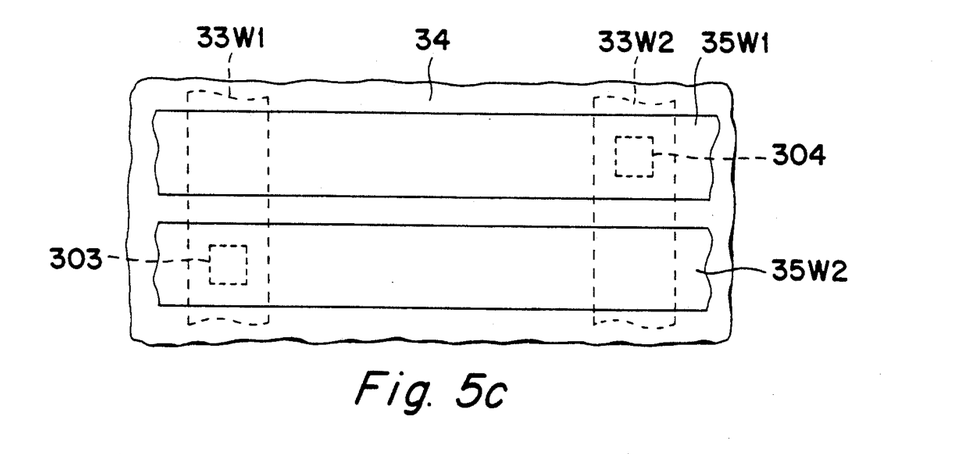

Following these processes, as shown in FIG. 5c, after removing the photoresist film 39, second level wirings 35W1 and 35W2 made of aluminum are formed on the surface of the first interlayer insulating film 34. Buried substance buried in the openings formed at the first-alignment-check-pattern part, regular scale patterns 37a–37e of the second alignment check pattern shown in FIG. 3b and second dummy patterns 35a–35e of the third alignment check patterns shown in FIG. 3d are also formed at the same time when the second level wirings are formed. Each of the wirings 35W1 and 35W2, the patterns 37a–37e and 35a–35e, and the buried substance have the same thickness and is made of same material. In addition, connections between the wiring 33W2 and the wiring 35W1 via through hole 304, between the wiring 33W1 and the wiring 35W2 via the through hole 303 are performed respectively.

Figure 5D:
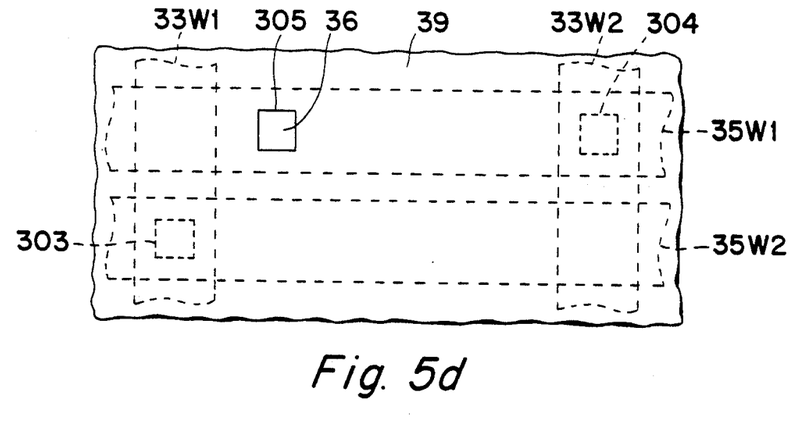

Following above processes, as shown in FIG. 5d, the second interlayer insulating film 36 is formed. It covers the second level wirings, the buried substance at the first-alignment-check-pattern part, the regular scale patterns of the second alignment check pattern, the second dummy patterns of the third alignment check pattern and the first interlayer insulating film. A photoresist film 39 is formed on the second interlayer insulating film 36. In addition, an opening 305, which is used for through hole formation, is provided for the photoresist film 39. The vernier scale patterns 39a–39e of the second alignment check pattern are also formed at the same time when the opening is formed. Then, an alignment check, which uses the regular scale patterns and the vernier scale patterns of the second alignment check pattern, is performed. After this, a second through hole 306 is provided for the second interlayer insulating film using the photoresist film 39 as a mask. As the vernier scale patterns 39a–39e are openings formed at the photoresist film 39, openings are formed at the second-alignment-check-pattern part of the second interlayer insulating film 36.

Figure 5E:
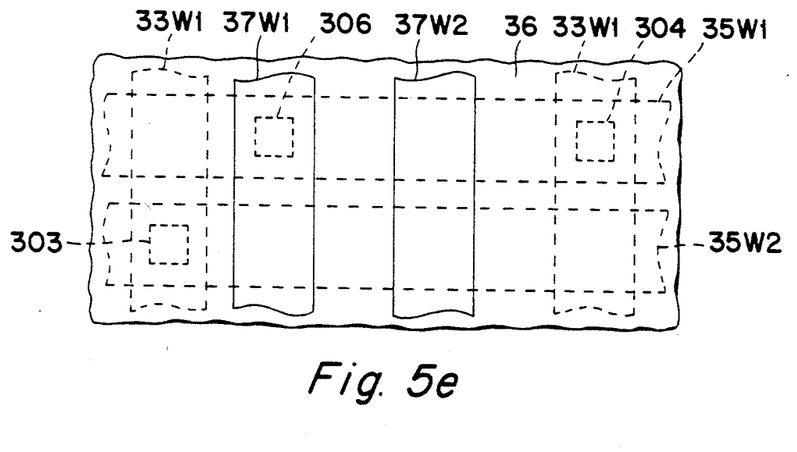

After removing the photoresist film 39, as shown in FIG. 5e, third level wirings 37W1 and 37W2 made of aluminum are formed on a surface of the second interlayer insulating film 36. A buried substance buried in the openings at the second-alignment-check-pattern part and regular scale patterns 37a–37e of the third alignment check pattern are also formed at the same time when the third level wirings are formed. The wirings 37W1 and 37W2, the buried substance at the second-alignment-check-pattern part and the patterns 37a–37e are made of the same material and have same thickness. As the result of these processes, the second level wiring 35W1 and the third level wiring 37W1 are connected to each other via the second through hole 306 formed at the second interlayer insulating film 36.

Figure 5F:
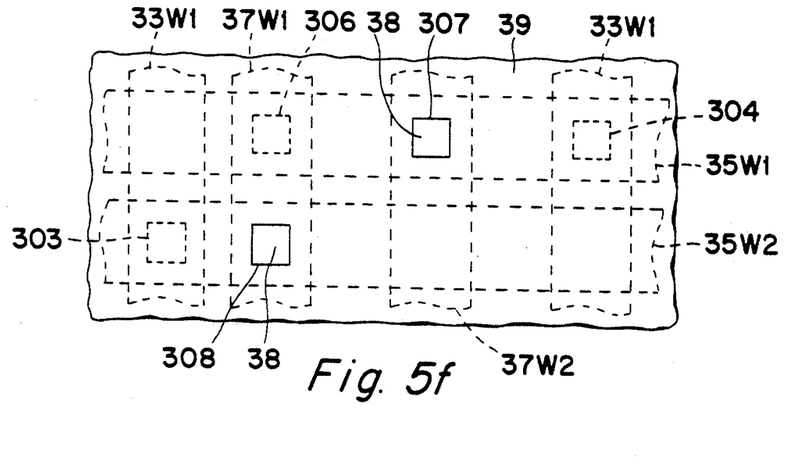

Then, as shown in FIG. 5f, the third interlayer insulating film 38 is formed. The film 38 covers the third level wirings, the buried substance at the second-alignment-check-pattern part, the regular scale patterns of the third alignment check pattern and the second interlayer insulating film. Then, a photoresist film 39 is formed on the third interlayer insulating film 38. Following the process, openings 307 and 308, which are used for third-through-hole formation are provided for the photoresist film 39. Vernier scale patterns 39a–39e are also formed at the photoresist film 39 at the same time when the openings are formed at the film 39. Then an alignment check is performed using the regular scale patterns and the vernier scale patterns of the third alignment check pattern. Following the alignment check, a third through hole is provided for the third interlayer insulating film 38 using the photoresist film 39 as an etching mask. Then, after removing the film 39, fourth level wirings are formed on a surface of the third interlayer insulating film. As the result of these manufacturing processes, the fourth-level-interconnection structure is formed. According to the present embodiment for the second alignment check pattern, rectangular-parallelepiped-shape dummy patterns 35a–35e are formed between the first interlayer insulating film 34 and the insulating film 32. In addition, the dummy patterns are formed below the regular scale patterns 37a–37e of the second alignment check pattern, and cross the regular scale patterns of it. Consequently, the surface of the second interlayer insulating film 36 on the regular scale patterns 37a–37e of the second alignment check pattern becomes level with the surface of the second interlayer insulating film 36 on the second level wirings 35W1 and 35W2. Therefore, the surface of the photoresist film 39 which is formed on the film 36 becomes level. Consequently, when the exposure to form opening 305 at the photoresist film 39 is performed, reliability of the vernier scale pattern formation can be improved because it prevents being out of the second alignment check patterns. In addition, according to the present embodiment for the third alignment check pattern, the second dummy patterns 35a–35e having rectangular-parallelepiped shape are formed between the first interlayer insulating film 34 and the second interlayer insulating film 36, and the first dummy patterns 33a–33e are formed between the insulating film 32 and the first interlayer insulating film 34. Moreover, the second dummy patterns 35a–35e are formed below the regular scale patterns 37a–37e and cross the regular scale patterns, and the first dummy patterns 33a–33e are formed below the second dummy patterns and cross the regular scale patterns. Consequently, the surface of the third interlayer insulating film 38 on the regular scale patterns of the third alignment check pattern becomes level with the surface of the third interlayer insulating film 38 on the third level wirings 37W1 and 37W2. Therefore, the surface of the photoresist film 39 which is formed on the film 38 becomes level. Consequently, at the exposure process to form openings 307 and 308 in the photoresist film 39, the reliability of forming the vernier scale patterns in the photoresist film 39 can be raised because it prevents the exposure from becoming out of focus. Accordingly, alignment for the multilevel interconnection of more than three levels can be performed accurately.

Moreover, as the dummy patterns are arranged in predetermined intervals, regions in which the dummy patterns do not exist are generated. Therefore, even if the dummy patterns and the regular scale patterns are either metal films made of the same substance or metal films having similar color, a distinction of the dummy patterns from an edge of the regular scale patterns becomes easy, and detection accompanied by the vernier scale patterns of the misalignment amount easily results. Furthermore, when the second dummy patterns have the same shape as the first dummy patterns and are located right over the first dummy patterns, because the regions where the dummy patterns do not exist do not decrease, the alignment check easily results. In case that one dummy pattern, which is formed below a plurality of the regular scale patterns, is formed to cover an entire surface of the insulating film 32, and the regular scale patterns and the dummy pattern are either made of the same material or made of a metal film with a similar color, it becomes difficult to distinguish where the edges of the regular scale pattern are. Therefore, it is favorable to provide an alignment check pattern with a plurality of dummy patterns at predetermined intervals.

Figure 4A:
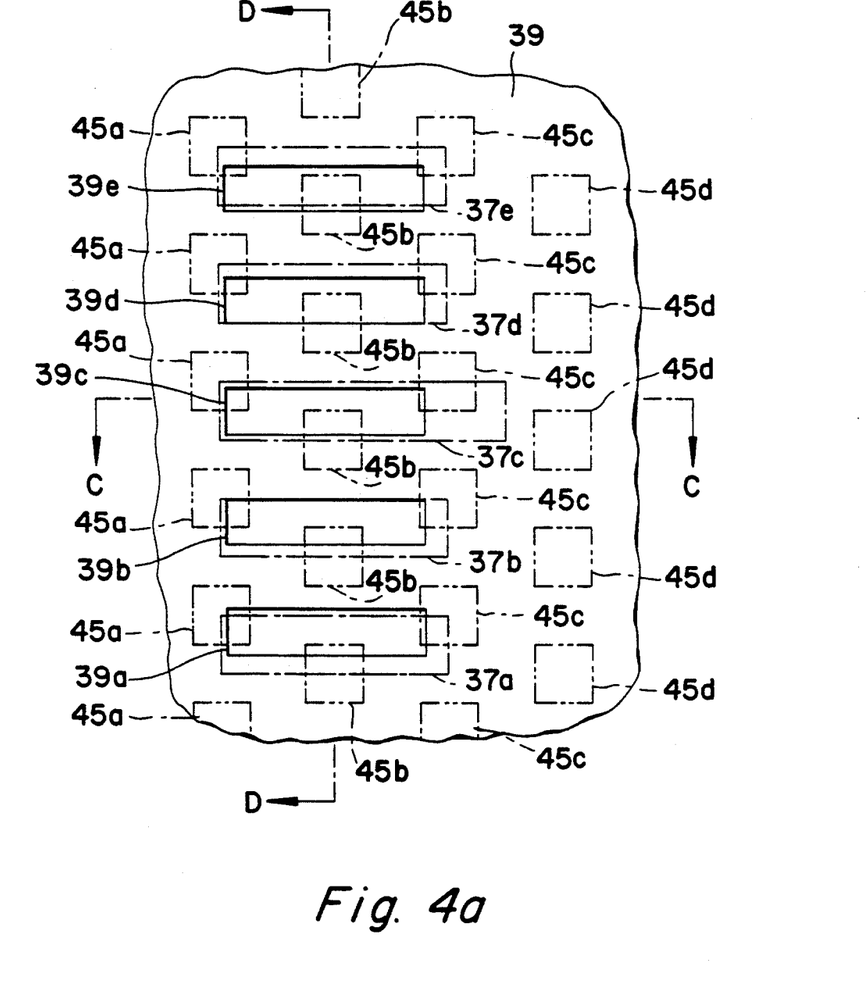
FIG. 4a is a plan view showing a second embodiment of the present invention.
Figure 4B:
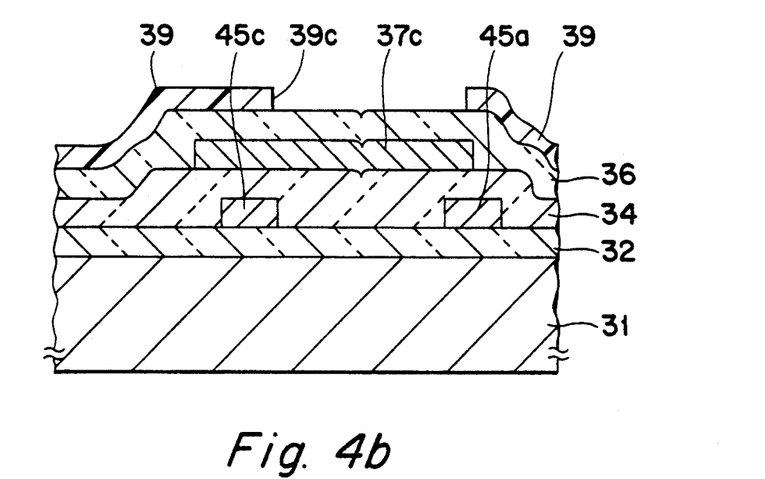
Figure 4C:
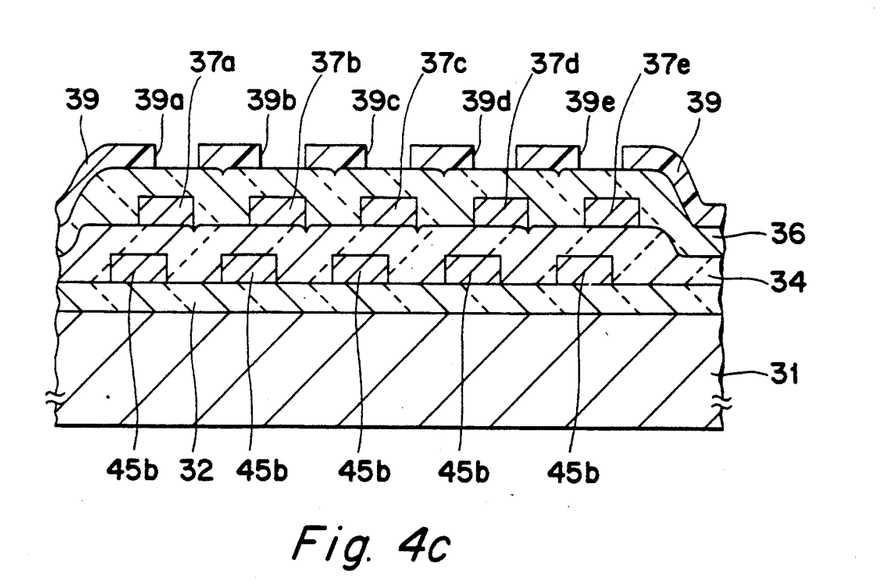
Figure 4D:
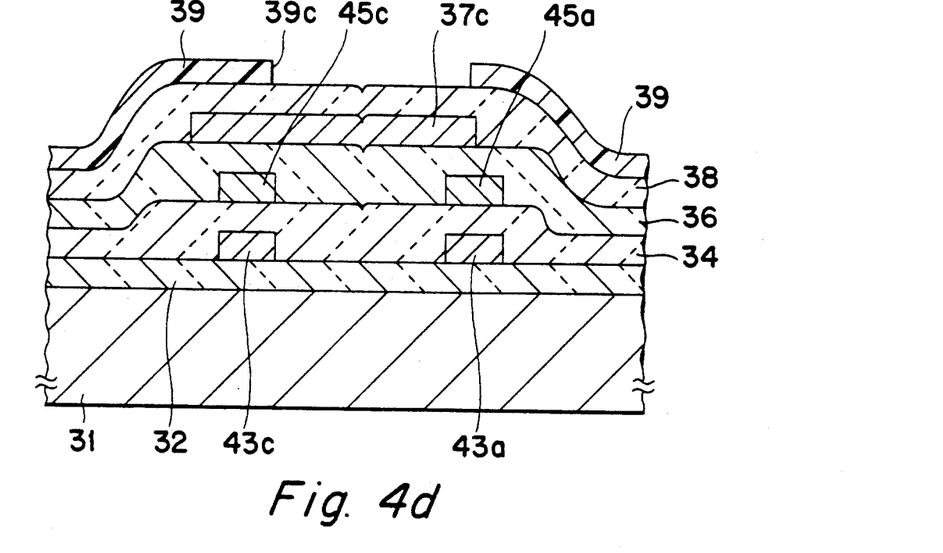
Figure 4E:
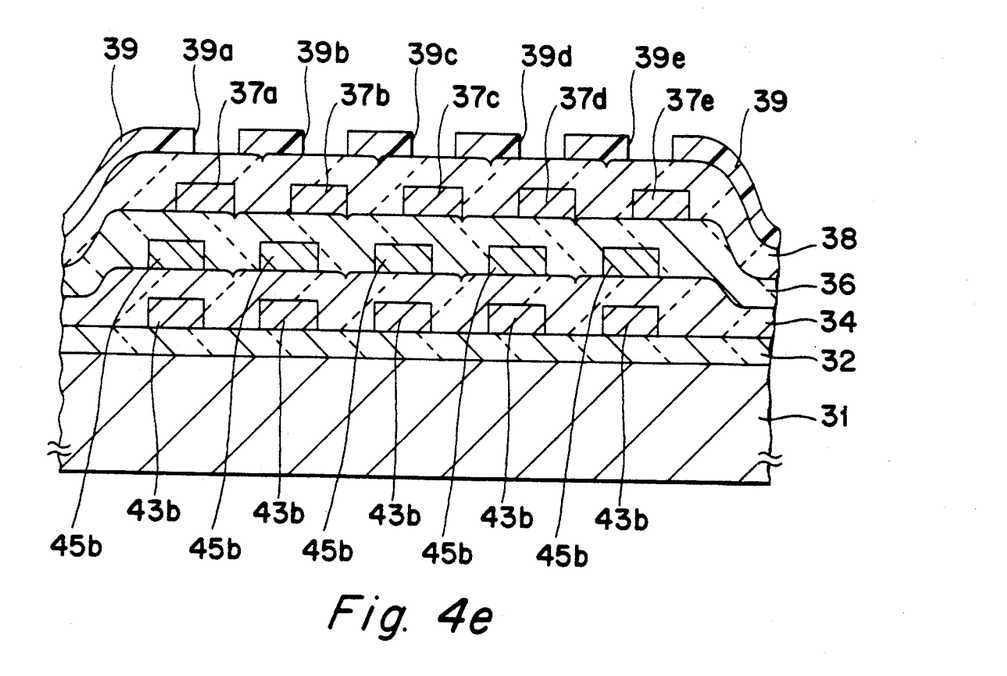

Referring to the drawings, a second embodiment of the present invention will be described below. The components in this embodiment which are identical to those in FIGS. 3a–3d are assigned identical symbols to omit further explanation. As shown in FIG. 4a, the present embodiment is characterized in that square shaped dummy patterns 45a–45d are formed instead of the dummy patterns of the first embodiment. The dummy patterns 45a–45e are shown by chain, double-dashed lines. As shown in FIG. 4a, three dummy patterns 45a, 45b and 45c and one regular scale pattern are overlapped. The dummy patterns are formed in a manner that two angles at both sides of a horizontal side of the regular scale pattern 39a and the dummy patterns 45a and 45c respectively overlap, and a central part of another horizontal side of the regular scale pattern 39a also overlaps with the dummy pattern 45b. Dummy patterns 45d are formed apart from the regular scale patterns. FIGS. 4b and 4c are sectional views of the second alignment check pattern used for an arrangement between the second level wirings 35W1 and 35W2 shown in FIG. 5c and the second through hole 306 provided for the second interlayer insulating film 36. They are sectional views taken along the C—C line and the D—D line of the FIG. 4a, respectively. Each of the dummy patterns 45a–45d is a square with sides of 2.0 μm and is arranged in intervals of 2.0 μm, for example. FIGS. 4d and 4e are sectional views of the third alignment check pattern used for arrangement between the third level wirings 37W1 and 37W2 shown in FIG. 5e and the third through hole provided for the interlayer insulating film 38. They are sectional views along the C—C line and the D—D line of the FIG. 4a. Second dummy patterns 45a–45d are formed between the first interlayer insulating film 34 and the second interlayer insulating film 36 besides below the regular scale patterns 37a–37e. First dummy patterns 43a–43d are formed between the insulating film 32 and the first interlayer insulating film 34 besides below the second dummy patterns 43a–43d. In this embodiment, the dummy patterns 45a–45d of the second alignment check pattern are also formed at the same time when the patterning for formation of the first level wirings 33W1 and 33W2 is performed In addition, the second dummy patterns 45a–45d and the first dummy patterns 43a–43d of the third alignment check pattern are also formed at the same time when the second level wirings 35W1 and 35W2 shown in FIG. 5c and the first level wirings 33W1 and 33W2 shown in FIG. 5a are patterned, respectively. Therefore, the first level wirings 33W1 and 33W2, the dummy patterns 45a–45d of the second alignment check pattern and the first dummy patterns 43a–43d have a same thickness and are made of the same material, for example, aluminum. In addition, the second level wirings 35W1 and 35W2, the regular scale patterns 37a–37e of the second alignment check pattern and the second dummy patterns 45a–45d of the third alignment check pattern have the same thickness and are made of the same material, for example, aluminum.

According to the present embodiment for the second alignment check pattern, the dummy patterns 45a–45d are formed below the regular scale patterns 37a–37e. In addition, the formation of the dummy patterns and the patterning of the first level wirings are performed simultaneously. Therefore, the height of the surface of the second interlayer insulating film 36 on the regular scale patterns 37a–37e from the insulating film 32 becomes equal to the height of that on the second level wirings 35W1 and 35W2 from it. Consequently, the surface of the photoresist film 39 formed on the surface of the second interlayer insulating film 36 becomes level. Accordingly, when the exposing of the photoresist film 39 to form the second through hole in the second interlayer insulating film 36 is performed, an exposure for opening the vernier scale patterns 39a–39e is also executed accurately. Therefore, accurate formation of the vernier scale patterns can be performed. In addition, as the dummy patterns are formed with a small size compared to that of the first embodiment, the regions where the dummy patterns do not exist increases. Therefore, the detection of where the edges of the regular scale patterns are can be performed easy. Consequently, the detection accuracy of a misalignment amount at the alignment exposure process can be raised.

Moreover, according to the present embodiment for the third alignment check pattern, the second dummy patterns 45a–45d are formed below the regular scale patterns 37a–37e and the first dummy patterns 43a–43d are formed right below the second dummy patterns 45a–45d. In addition, the second level wirings and the second dummy patterns are formed at the same time. The first level wirings and the first dummy patterns are formed simultaneously. Therefore, the height of the surface of the third interlayer insulating film 38 on the regular scale patterns 37a–37e from the insulating film 32 becomes equal to the height of that on the third level wirings 37W1 and 37W2. Consequently, the surface of the photoresist film 39 formed on the surface of the third interlayer insulating film 38 becomes level. Accordingly, when the exposing of the photoresist film 39 to form the third through hole in the second interlayer insulating film 38 is performed, an exposure for opening the vernier scale patterns 39a–39e is also executed accurately. Therefore, accurate formation of the vernier scale patterns can be performed. In addition, as the first and the second dummy patterns are formed with a small size compared to that of the first embodiment, the regions where the dummy patterns do not exist increases. Therefore, the detection of where the edges of the regular scale patterns are can be performed easy. Consequently, the detection accuracy of a misalignment amount in the alignment exposure process can be raised. When the second dummy patterns are formed right over the first dummy patterns and have the same shape as the first dummy patterns, the regions where the dummy patterns do not exist increases. Therefore, the alignment check accuracy can be raised much more.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that appended claims will cover any modifications or embodiments as fall within the scope of the invention.

What is claimed is:

1. An alignment check pattern used for a multi-level interconnection having a first level wiring formed on a major surface of a first insulating film, a second insulating film formed to cover said major surface of said first insulating film and a surface of said first level wiring, a second level wiring formed on a surface of said second insulating film, and a third insulating film formed to cover a surface of said second insulating film and a surface of said second level wiring, said alignment check pattern comprising:

a plurality of dummy patterns formed apart from one another and between said first and said second insulating films, each of said dummy patterns having the same thickness as said first level wiring;

a regular scale pattern formed on said second insulating film and elongated to cross said plurality of dummy patterns in isolation therefrom by said second insulating film, said regular scale pattern having substantially the same thickness as said second level wiring; and a vernier scale pattern formed on a surface of said third insulating film positioned directly over said regular scale pattern.

2. The alignment check pattern as claimed in claim 1, wherein each of said dummy patterns has a rectangular shape.

3. The alignment check pattern as claimed in claim 1, wherein each of said dummy patterns has a square shape.

4. The alignment check pattern as claimed in claim 1, wherein said vernier scale pattern is an opening provided in a photoresist film.

5. An alignment check pattern used for a multi-level interconnection having a first level wiring formed on a major surface of a first insulating film, a second insulating film formed to cover said major surface of said first insulating film and a surface of said first level wiring, a second level wiring formed on a surface of said second insulating film, a third insulating film formed to cover a surface of said second insulating film and a surface of said second level wiring, a third level wiring formed on a surface of said third insulating film, and a fourth insulating film formed to cover a surface of said third insulating film and a surface of said third level wiring, said alignment check pattern comprising:
- a first dummy pattern formed between said first and said second insulating films, and substantially has the same thickness as said first level wiring;
- a second dummy pattern formed between said second and said third insulating films, and positioned directly over said first dummy pattern, and substantially has the same thickness as said second level wiring;
- a regular scale pattern formed between said third and said fourth insulating films, and positioned directly over said second dummy pattern, and substantially has the same thickness as said third level wiring; and
- a vernier scale pattern formed on a surface of said fourth insulating film and positioned directly over said regular scale pattern.

6. The alignment check pattern as claimed in claim 5, wherein said second dummy pattern substantially has the same shape as said first dummy pattern and formed directly over said first dummy pattern.

7. The alignment check pattern as claimed in claim 5, wherein said second dummy pattern substantially has rectangular shape, and crosses said regular scale pattern.

8. The alignment check pattern as claimed in claim 7, wherein said first dummy pattern substantially has the same shape as said second dummy pattern, and is formed directly below said second dummy pattern.

9. The alignment check pattern as claimed in claim 5, wherein said second dummy pattern has a square shape, and is formed directly below said regular scale pattern.

10. The alignment check pattern as claimed in claim 9, wherein said first dummy pattern substantially has the same shape as said second dummy pattern, and is formed directly below said second dummy pattern.

11. An alignment check pattern comprising:
- a first insulating film;
- a plurality of dummy patterns formed on a surface of said first insulating film;
- a second insulating film formed on a composite surface of said first insulating film and said plurality of dummy patterns;
- a regular scale pattern formed on a surface of said second insulating film to cross said plurality of dummy patterns in isolation therefrom by said second insulating film;
- a third insulating film formed on a composite surface of said second insulating film and said regular scale pattern; and
- a vernier scale pattern formed on a surface of said third insulating film positioned directly over said regular scale pattern.

12. The alignment check pattern as claimed in claim 11, wherein said regular scale pattern includes a plurality of segments, and wherein each of said dummy patterns is a rectangular shape, each of said segments crossing a plurality of said dummy patterns.

13. The alignment check pattern as claimed in claim 1, wherein said regular scale pattern includes a plurality of segments, and wherein each of said dummy patterns is a square shape, each of said segments crossing a plurality of said dummy patterns.

14. The alignment check pattern as claimed in claim 11, wherein said vernier scale pattern is a plurality of openings provided in a photoresist film.

15. An alignment check pattern comprising:
- a first insulating film;
- a first dummy pattern formed on a surface of said first insulating film;
- a second insulating film formed on a composite surface of said first insulating film and said first dummy pattern;
- a second dummy pattern formed on said second film, and positioned directly over said first dummy pattern in plan view;
- a third insulating film formed on a composite surface of said second insulating film and said second dummy pattern;
- a regular scale pattern formed on said third insulating film, and positioned directly over said second dummy pattern;
- fourth insulating film formed on a composite surface of said third insulating film and said regular scale pattern; and
- a vernier scale pattern formed on a surface of said fourth insulating film and positioned directly over said regular scale pattern.

16. The alignment check pattern as claimed in claim 15, wherein said first dummy pattern includes a plurality of first shapes, and wherein said second dummy pattern includes a plurality of second shapes each having substantially the same shape as each of said plurality of first shapes of said first dummy pattern and formed directly over each of said plurality of first shapes of said first dummy pattern.

17. The alignment check pattern as claimed in claim 15, wherein said regular scale pattern includes a plurality of shapes, and wherein said second dummy pattern includes a plurality of second, substantially rectangular shapes which is directly below said plurality of shapes of said regular scale pattern.

18. The alignment check pattern as claimed in claim 17, wherein said first dummy pattern includes a plurality of shapes each having substantially the same shape as each of said plurality of the second dummy pattern, and is formed directly below each of said plurality of shapes of said second dummy pattern.

19. The alignment check pattern as claimed in claim 15, wherein said regular scale pattern includes a plurality of shapes, and wherein second dummy pattern includes a plurality square shapes formed to overlap said plurality of shapes of said regular scale pattern.

20. The alignment check pattern as claimed in claim 19, wherein said first dummy pattern includes a plurality of shapes each of which having substantially the same shape as each of said plurality shapes of said second dummy pattern, and is formed directly below said plurality of shapes of said second dummy pattern.

* * * * *